United States Patent [19]

McIngvale

[11] 3,866,065

[45] Feb. 11, 1975

[54] WAVEFORM CONTROL CIRCUIT USING GAIN-CONTROLLED AMPLIFIER STAGE

[75] Inventor: Pat H. McIngvale, Huntsville, Ala.

[73] Assignee: The United States of America as represented by the Secretary of the Army, Washington, D.C.

[22] Filed: Feb. 21, 1974

[21] Appl. No.: 444,580

Related U.S. Application Data

[63] Continuation-in-part of Ser. No. 298,194, Oct. 17, 1972, abandoned.

[52] U.S. Cl. .................. 307/260, 307/264, 328/168, 328/178, 330/135, 330/137

[51] Int. Cl. .............................................. H03k 1/14

[58] Field of Search .................... 307/260, 261, 264; 328/142, 143, 160, 171, 178, 185, 187, 188, 168; 330/137, 135

[56] References Cited

UNITED STATES PATENTS

| | | | |
|---|---|---|---|
| 2,899,550 | 8/1959 | Meissinger et al. | 328/143 X |
| 2,930,987 | 3/1960 | Groce et al. | 328/171 X |
| 3,368,153 | 2/1968 | Garde | 328/164 |
| 3,684,968 | 8/1972 | Carrol | 328/142 |
| 3,714,602 | 1/1973 | Macey | 330/35 X |

*Primary Examiner*—John Zazworsky
*Attorney, Agent, or Firm*—Edward J. Kelly; Herbert Berl; Aubrey J. Dunn

[57] ABSTRACT

A circuit using a slope generator and an inverter providing biases for a network including a parallel combination of series-connected diodes and resistors. The network is connected between a voltage source and a gain control input of an amplifier stage. The biases control turn-on of the diodes in the network to vary the voltage applied to the gain control input.

3 Claims, 3 Drawing Figures

WAVEFORM CONTROL CIRCUIT USING GAIN-CONTROLLED AMPLIFIER STAGE

CROSS REFERENCE TO RELATED APPLICATION

This application is a Continuation-In-Part of my earlier copending application Serial Number 298,194, filed October 17, 1972, and now abandoned.

SUMMARY OF THE INVENTION

The invention is a circuit for providing a particular waveform output by feeding a ramp voltage and an inverted ramp voltage to a network consisting of diodes and resistors. The diodes and resistors are connected in series parallel combinations such that various diodes conduct as the ramp and inverted ramp voltages vary. An output from the network provides the gain control signal for an amplifier stage.

DETAILED DESCRIPTION OF THE INVENTION

Figure 1:
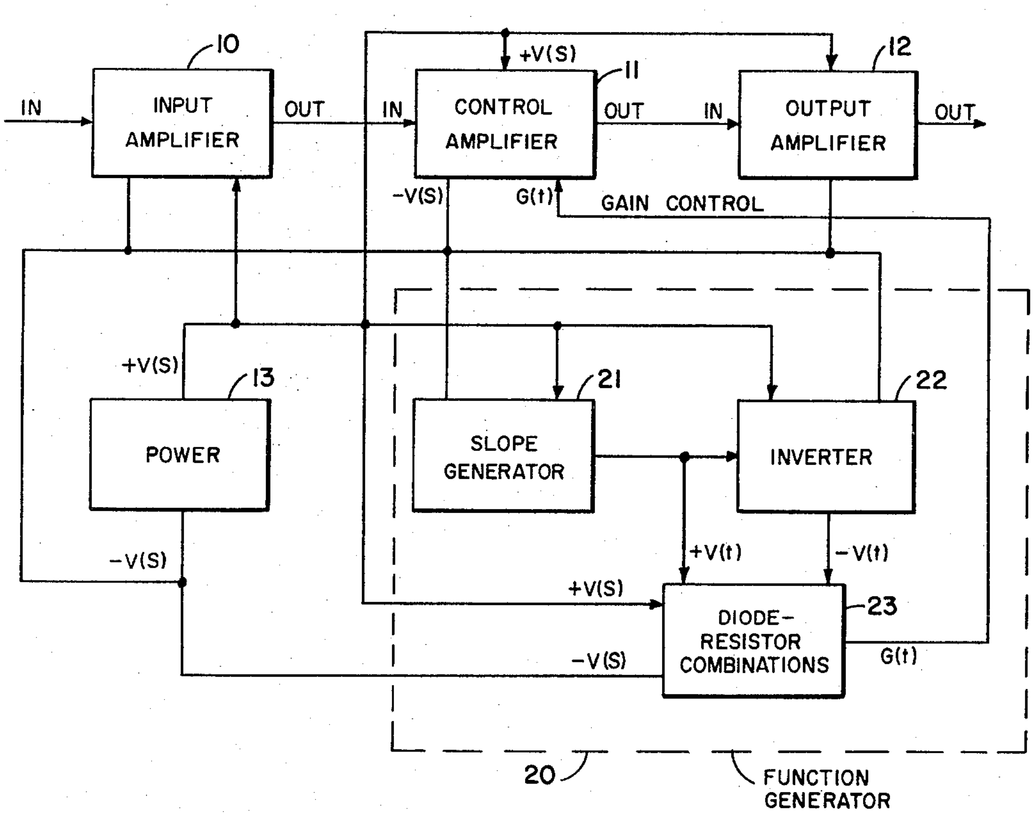
FIG. 1 is a schematic diagram of the invention.

Referring now to FIG. 1, the invention may include input amplifier 10, control amplifier 11, and output amplifier 12; only control amplifier 11 is actually necessary to the invention. These amplifiers (and other means yet to be described) are all powered from a power source 13 have +V(*s*) and −V(*s*) connections. A typical value for V(s) is ±15 volts. An input signal whose waveform is to be controlled is applied to the input of amplifier 10. The output of 10 is the input of 11 and the output of 11 is the input of 12. The output of 12 is the desired waveform, with the desired amplitude. Obviously, the output of 11 is of the desired waveform and could be used directly, if of sufficient amplitude.

The waveform of a signal applied at the input of 10 is controlled by varying with time the gain of control amplifier 11. The variation in gain of 11 effectively varies the waveform at the output of 12. Amplifiers 10 and 12 are linear amplifiers with fixed gains.

Variation in the gain of 11 is accomplished in function generator 20. This generator includes slope generator 21, inverter 22, and diode-resistor combinations 23. Slope generator 21 produces a signal +V(*t*) linearly varying with time. Inverter 22 inverts +V(*t*) and provides a signal −V(*t*). Both +V(*t*) and −V(*t*), and +V(*s*) and −V(*s*) are applied to the diode-resistor combinations 23. The varying voltages +V(*t*) and −V(*t*) cause conduction of various diodes in 23 to eventually produce an output signal G(*t*) from 23. This G(*t*) is applied as the gain control signal to control amplifier 11.

Figures 2, 3:
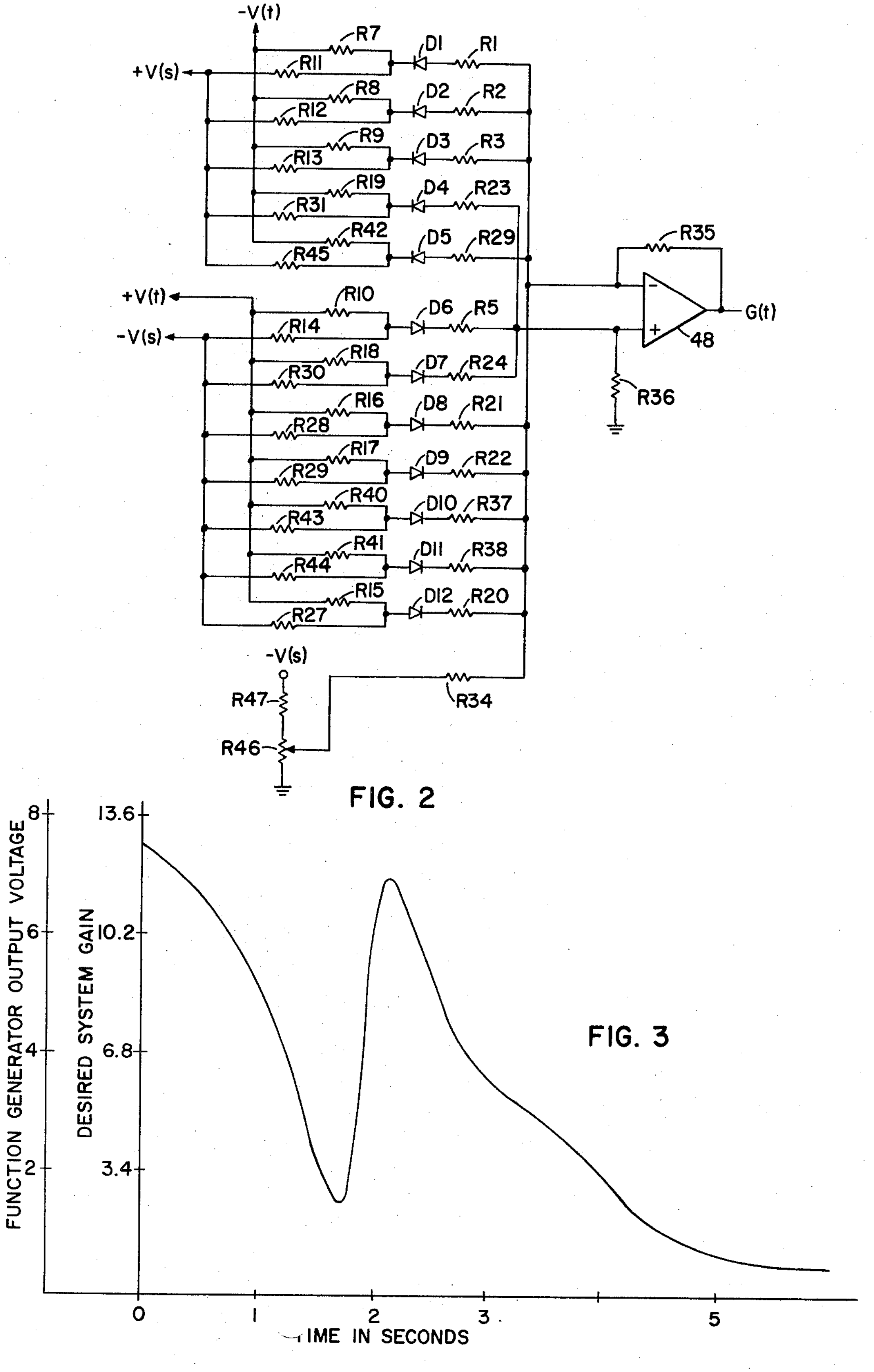
FIG. 2 is a schematic diagram of the Function Generator of FIG. 1.
FIG. 3 is a chart of the waveform provided by the invention.

Operation of the diode-resistor combinations may be more readily understood by reference to FIG. 2. As can be seen in the top portion of FIG. 2, pairs of resistors such as R7/R11, R8/R12, etc. are connected between voltages +V(*s*) and −V(*t*). Diodes D1–D5 have their respective cathodes connected to the respective connections between the pairs of resistors. Respective resistors R1, R2, R3, R23, and R29 are each connected at one end to the anodes of diodes D1-D5. The other end of R23 is connected to the positive input of differential amplifier; the other ends of R1–R3 and R29 are connected to the negative input of differential amplifier 48 and through resistor R34 to the slider on potentiometer R46. One end of R46 is grounded and the other end is connected to −V(*s*) through resistor R47. The R34, R46, R47 combination acts as a variable bias to set the D-C level of the FIG. 3 waveform. In the bottom portion of FIG. 2, pairs of resistors such as R10/R14 and R18/R30 are connected between voltages +V(*t*) and −V(*s*), with the junctions between respective resistors pairs being connected to respective anodes of diodes D6–D12. Resistors R5, R24, R21, R22, R37, R38, and R20 are respectively connected on one end to the cathodes of diodes D6–D12. The other end of each of R5 and R24 are connected to the positive input of differential amplifier 48; the other ends of R21, R22, R37, R38, and R20 are connected to the negative input of differential amplifier 48 and to resistor R34. FIG. 2 may thus be described as including a first set of series-connected resistors and diodes R1, 2, 3, 23, 29, 7, 8, 9, 19, 42, 45, 11, 12, 13, 31, and D1–D5 and a second set of series-connected resistors and diodes R5, 24, 21, 22, 37, 38, 20, 10, 14, 18, 30, 16, 28, 17, 29, 40, 43, 41, 44, 15, 27, and D6–D12. The first set includes four subsets of resistors: one subset comprises R7, 8, 9, 19, and R42; the second subset comprises R11, 12, 13, 31, and R45; the third subset comprises R1, 2, 3, and R29; the fourth subset comprises only R23. In like manner, the second set includes a first subset comprising R10, 18, 16, 17, 40, 41, and R15, a second subset comprising R14, 30, 28, 29, 43, 44, and R27, a third subset comprising R21, 22, 37, 38, and R20, and a fourth subset comprising R5 and R24. Amplifier 48 has resistor R35 connected for feedback, and resistor R36 as an input resistor. The output of 48 is the signal G(*t*) which is applied to control amplifier 11.

The operation of the invention is straightforward. A signal whose waveform is to be controlled is applied through linear input amplifier 10 to control amplifier 11. The gain of 11 is varied in the predetermined manner of FIG. 3 by function generator 20. The output of 11 is amplified by linear amplifier 12, with the output of 12 serving as the invention output. The function generator operates by employing various combinations of resistors and diodes fed linearly varying voltages. As the various diodes conduct, a gain control voltage is produced for amplifier 11. The linearly varying voltages come from slope generator 21 and inverter 22 and are also known in the art as "ramp" signals. The voltages go through their ranges of values in approximately 6 seconds, for the component values given below. The inventive circuit could then be reset, for another cycle of operation. The invention is not concerned with the means (not shown) for resetting, etc., but is a more or less "one-shot" circuit.

Typical values of the various resistors in FIG. 2 for the waveform of FIG. 3 are as follows (5% tolerance except as noted):

| Resistor | Ohms |
|---|---|
| R1–R3, R7–R10, R15–R19, R40–R42, R47 | 10K |
| R5,R23,R24 | 4.7K |
| R11 | 110K |
| R12 | 82K |
| R13 | 125K (1%) |
| R14 | 120K (1%) |
| R20–R22, R36 | 11K |
| R27 | 1M |
| R28 | 100K (1%) |

-Continued

| | |
|---|---|
| R29 | 150K (1%) |
| R30 | 120K |
| R31 | 91K |
| R34, R35 | 110K |
| R37, R38 | 5.6K |
| R39 | 25.5K (1%) |
| R43 | 75K |
| R44 | 75K (1%) |
| R45 | 31.6K (1%) |
| R46 | 0–2OK |

All of the diodes in FIG. 2 may be 1N648's.

Reference may now be made to the waveform of FIG. 3. For a voltage from 21 having a linear slope of 1.33 volts/sec., the FIG. 3 wave is produced.

Obviously the output of amplifier 12, for a constant input at amplifier 10, will resemble the waveform of FIG. 3. Other inputs to 10 will effectively be varied in the FIG. 3 manner. Control amplifier 11 could take the form of a multiplier circuit, in which the output of the circuit is the product of the input from 10 and the G($t$) input.

While a specific embodiment of the invention has to be disclosed, other embodiments may be obvious to ones skilled in the art in view of this disclosure. For example, the values of the resistors and/or their number and/or the type of diodes may be varied to produce a different waveform from that in FIG. 3.

I claim:

1. An electrical waveform control circuit employing a gain controlled amplifier stage wherein said stage has at least a gain control input, a power input, and signal input and output terminals, said circuit including: power supply means having a positive terminal and a negative terminal; function generating means connected to said power supply means and including means connected between said power supply means and said gain control input of said amplifier stage, wherein said function generating means includes means for generating a wave linearly increasing from a value less than the potential of the positive terminal of said power supply up to the value of said potential, combining means having inputs and an output; means connected to said means for generating for providing a wave linearly decreasing from said potential to a value less than said potential, said means connected between said power supply means and said gain control input including first and second sets of series-connected resistors and diodes, each set including first and second subsets of resistors, each subset in a set having the same number of resistors and having a common connection at one end of said resistors, said common connections of said first subsets being respectively connected to positive and negative terminals of said power supply means, said common connections of said second subsets being connected respectively to said means for generating a wave linearly increasing and said means for generating a wave linearly decreasing, the opposite ends of said resistors in said subsets being connected in pairs, one from each first and second subset in a set, to one end of respective diodes, said first and second sets further including third and fourth subsets of resistors with one end of each of said resistors in said third and fourth subsets being connected to a respective opposite end of said diodes, the other ends of said resistors in said third subsets being connected in common to one input of said combining means and to bias means connected to the negative terminal of said power supply means, the other ends of said resistors of said fourth subset being connected to another input of said combining means, and the output of said combining means connected to said gain control input of said amplifier stage.

2. The circuit as set forth in claim 1 wherein said diodes in said sets are oppositely poled.

3. The circuit as set forth in claim 2 wherein said combining means is a differential amplifier.

* * * * *